United States Patent [19]
Horiba

[11] Patent Number: 6,150,228
[45] Date of Patent: Nov. 21, 2000

[54] METHOD OF MANUFACTURING AN SRAM WITH INCREASED RESISTANCE LENGTH

[75] Inventor: Shinichi Horiba, Tokyo, Japan

[73] Assignee: NEC Corporation, Tokyo, Japan

[21] Appl. No.: 09/084,701

[22] Filed: May 26, 1998

[30] Foreign Application Priority Data

May 23, 1997 [JP] Japan ................................. 9-150409

[51] Int. Cl.[7] ........................ H01L 21/20; H01L 21/8244
[52] U.S. Cl. ........................... 438/384; 438/382; 438/238
[58] Field of Search ................................ 438/238, 382, 438/384

[56] References Cited

U.S. PATENT DOCUMENTS

| | | | |
|---|---|---|---|
| 5,012,443 | 4/1991 | Ema | 365/51 |
| 5,543,350 | 8/1996 | Chi et al. | 438/238 |
| 5,721,166 | 2/1998 | Huang et al. | 438/238 |
| 5,747,369 | 5/1998 | Kantimahanti et al. | 438/241 |
| 5,846,878 | 12/1998 | Horiba | 438/636 |
| 5,946,565 | 8/1999 | Ikeda et al. | 438/238 |
| 5,949,113 | 9/1999 | Ota et al. | 257/380 |

FOREIGN PATENT DOCUMENTS

| | | |
|---|---|---|
| 63-80566 | 4/1988 | Japan . |
| 5-90540 | 4/1993 | Japan . |

*Primary Examiner*—Savitri Mulpuri
*Assistant Examiner*—Jennifer M. Kennedy
*Attorney, Agent, or Firm*—Hutchins, Wheeler & Dittmar

[57] ABSTRACT

A silicon nitride layer on a ground wire is used for an etching stopping layer so as to form a trench, after which a high-resistance load element is formed so as to extend the length of the resistance by the amount of the step of the trench, and by forming the high-resistance load element in two layers, the resistance length is made large.

8 Claims, 9 Drawing Sheets

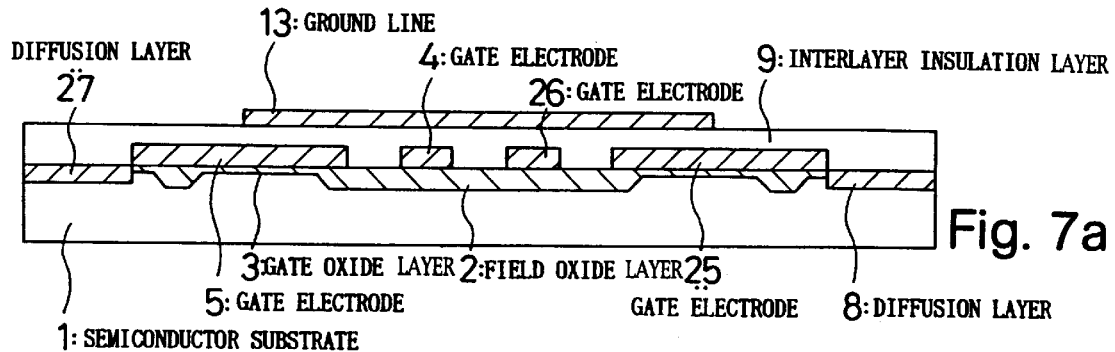
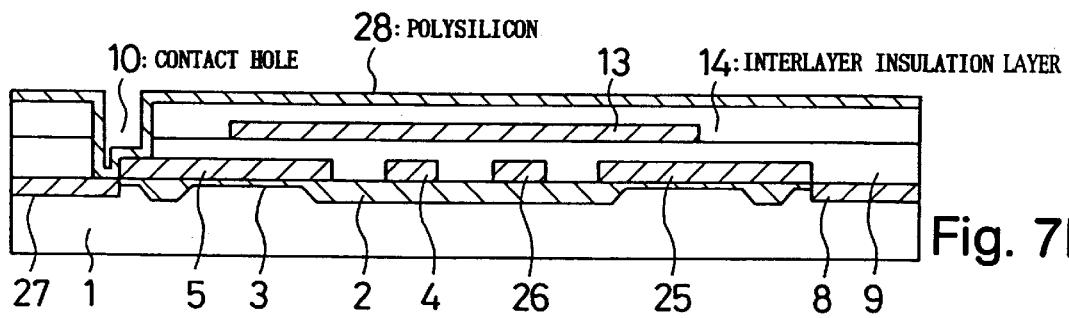
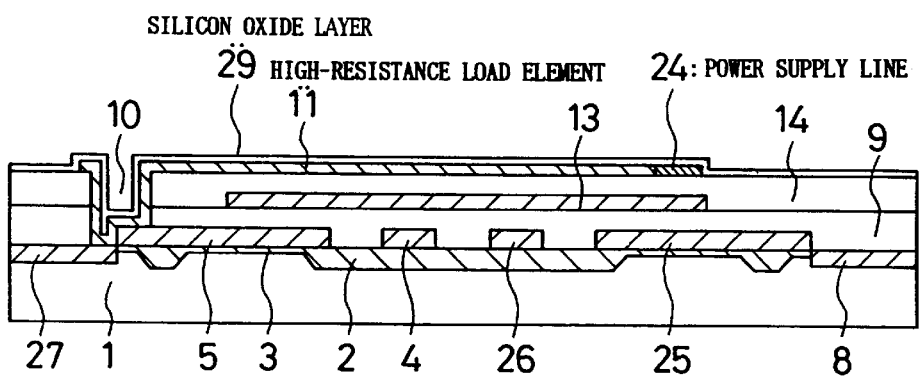
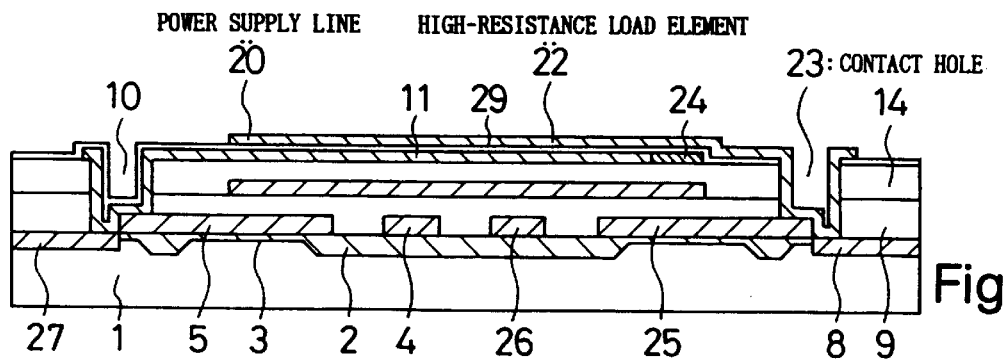

METHOD OF MANUFACTURING AN SRAM WITH INCREASED RESISTANCE LENGTH

BACKGROUND OF THE INVENTION

1. Field of the Invention

The present invention relates to a semiconductor device and to a method of manufacturing a semiconductor device, and more specifically to an SRAM (static random access memory).

2. Description of Related Art

A static memory cell is made up of two high-resistance load elements and four n-channel MOS transistors. FIG. 11 shows an equivalent circuit of a static memory cell.

Referring to FIG. 11, the drain of each of the pair of MOS driver transistors T1 and T2 is connected to the gate of other MOS driver transistor, and to each drain thereof is connected the load resistances R1 and R2, respectively, the sources of the MOS transistors T1 and T2 being fixed to the ground potential Vss.

The other ends of the resistances R1 and R2 are supplied with the power supply voltage Vcc, so that the flip-flop circuit formed by the MOS transistors T1 and T2 and the resistances R1 and R2 is supplied with a minute current. The transfer MOS transistors T3 and T4 are connected to the storage nodes N1 and N2 of this flip-flop circuit.

The above-noted four transistors and two resistances form a 1-bit cell. In this drawing FIG. 11, the reference numeral 1a denotes a word line, while 2a and 2b are data lines.

In a static memory of the past, because one end of the load resistances of the memory cell was a power supply line that was doped with a high concentration of an impurity, and the other end was connected to the MOS driver transistor, in subsequent thermal budget, because of diffusion of the impurity from the high-concentration region to the low-concentration region of the load resistance, it was necessary to have sufficient length in the resistance in order to maintain the resistance value.

However, with an increase in the degree of integration in semiconductor devices, it is becoming difficult to establish sufficient resistance length.

Because of the above-noted situation, in the Japanese Unexamined Patent Publication (KOKAI) No. 63-80566, there is proposed a configuration for the purpose of achieving a high degree of integration, while avoiding the problem of having the load resistance length govern the memory cell length, in which, in a resistive-load type of static semiconductor memory, the load resistance is made of polycrystal silicon having a multilayer structure separated by an insulation layer, each resistance layer being successively mutually connected via a connection hole which is formed in the insulation layers therebetween to the next resistance layer.

FIG. 12 will be used to describe the method of manufacturing the prior art example. FIG. 12 shows a vertical cross-sectional view of a static semiconductor memory of the past.

Referring to FIG. 12, after forming the transfer MOS transistor gate electrode 4 and driver MOS transistor gate electrode 5 on a semiconductor substrate 1, via an intervening field oxide layer 2 and gate oxide layer 3, a diffusion layer 8 is formed by ion implantation of a high concentration of an impurity.

Next, after forming an insulating layer 9, a contact hole 10 is formed in a prescribed region. After forming polycrystalline silicon, photolithography and etching are used to perform patterning of a high-resistance load element 11.

Next, an insulation layer 14 is formed, and a contact hole 19 is formed in a prescribed region.

Additionally, polysilicon is formed, and photolithography and etching are used to perform patterning of a high-resistance load element 21, and then photoresist is used to mask an end of the high-resistance load element 21 and a high-concentration impurity is formed by ion implantation, this serving as the power supply line 20.

In the above-noted prior art, there is the problem that the manufacturing process is complex. The reason for this is that the load resistances are formed by connecting two layers of high-resistance polysilicon.

An additional problem is that, while it is possible to maintain the resistance length by reduction of the cell surface area, there is no means provided to increase of the node capacitance, making it impossible to establish the node capacitance.

On the other hand, the Japanese Unexamined Patent Publication (KOKAI) No.5-90540 discloses a semiconductor memory device in that a capacity layer is provided at a common contacting point so as to prevent soft ware error from occurring when α ray is radiated thereto but it fails to show or suggest to expand the length of the high-resistance load element layer.

In view of the above-described drawbacks in the prior art, an object of the present invention is to provide a semiconductor device which enables attainment of a sufficient load resistance length and also enables an increase in the node capacitance, and which provides improved operating characteristics, and also to provide a method of manufacturing the above-noted semiconductor device.

SUMMARY OF THE INVENTION

To achieve the above-noted object, the present invention comprises the following basic technical conception as follows.

Note that a first aspect of the present invention is a semiconductor memory device that has a static type memory cell, which includes two MOS driver transistors, which are formed on a semiconductor substrate, two MOS transfer transistors and two high-resistance load elements, which are connected to the drains of each one of said two MOS driver transistors, respectively, and a power supply line, which supplies a power supply voltage, wherein said device comprises a substrate on which at least field oxide layers, gate electrodes and diffusion layers are formed, a first interlayer insulation layer, which is formed on said substrate, a patterned ground line that is formed on said first interlayer insulation layer, a surface thereof being covered with an etching stopping layer, a second interlayer insulation layer, which is formed on said first interlayer insulation layer, so as to cover said patterned ground line and foregoing elements and having a trench being formed therein so as to extend to the said etching stopping layer by penetrating through said second interlayer insulation layer, and a high-resistance load element layer being deposited onto a surface of said second interlayer insulation layer and inside surface of said trench.

A second aspect of the present invention is a semiconductor memory device that has a static type memory cell, which includes two MOS driver transistors, which are formed on a semiconductor substrate, two MOS transfer transistors and two high-resistance load elements, which are connected to the drains of each one of said two MOS driver transistors, respectively, and a power supply line, which supplies a power supply voltage, wherein said device comprises a substrate on which at least field oxide layers, gate electrodes and diffusion layers are formed, a first interlayer insulation layer, which is formed on said substrate, a patterned ground line that is formed on said first interlayer insulation layer, a second interlayer insulation layer, which is formed on said first interlayer insulation layer, so as to cover said patterned ground line and foregoing elements, at least a first and second contact holes being provided at both sides of said patterned ground line and each of which being extended from a top surface thereof to a portion where said gate electrode and said diffusion layer exist by penetrating said first and second interlayer insulation layers, a first high-resistance load element being formed on a surface of said second interlayer insulation layer and on an inside surface of said first contact hole, and a second high-resistance load element being formed on a surface of said first high-resistance load element with interposing an insulation layer.

And a third aspect of the present invention is a method for manufacturing a semiconductor memory device that has a plurality of static type memory cells, which include two MOS driver transistors, which are formed on a semiconductor substrate, two MOS transfer transistors and two load elements, which are connected to the drains of said two MOS driver transistors, and a power supply line, which supplies a power supply voltage, said manufacturing method comprising steps of; (a) forming a field insulation layer onto the surface of the above-noted semiconductor substrate and then forming a gate insulation layer; (b) forming a first conductive layer and then etching a prescribed region so as to form said MOS driver transistors and said MOS transfer transistors; (c) forming a first interlayer insulation layer; (d) forming a second conductive layer and a silicon nitride layer over said first interlayer insulating layer and then etching said second conductive layer and silicon nitride layer in a prescribed shape; (e) forming a second interlayer insulation layer thereover; (f) etching said first and second interlayer insulation layers over said silicon nitride layer and a node portion to form a trench therein; and (g) forming a third conductive layer and patterning a prescribed shape thereonto.

And a fourth aspect of the present invention is a method for manufacturing a semiconductor memory device that has a plurality of static memory cells, which include two MOS driver transistors, which are formed on a semiconductor substrate provided with gate electrodes and diffusion layers, two MOS transfer transistors and two load elements, which are connected to the drains of said two MOS driver transistors, and a power supply line, that supplies a power supply voltage, said manufacturing method comprising steps of; (a) forming a field insulation layer onto a surface of said semiconductor substrate provided with a gate electrodes and diffusion layers and then forming a gate insulation layer; (b) forming a first conductive layer and then etching a prescribed region thereof so as to form said MOS driver transistors and said MOS transfer transistors; (c) forming a first interlayer insulation layer and a second conductive layer and then performing patterning it to form a ground line; (d) forming a second interlayer insulation layer; (e) forming a first contact hole, which exposes a part of said gate electrode of said driver transistor and at least a part of said diffusion layer formed on said semiconductor substrate in a prescribed region; (f) forming and patterning a third conductive layer; (g) forming a first insulation layer; (h) forming a second contact hole, which exposes a part of said gate electrode of said driver transistor and at least a part of said diffusion layer formed on said semiconductor substrate in a prescribed region; and (i) forming a fourth conductive layer and patterning so that there is overlap with part of the third conductive layer.

BRIEF DESCRIPTION OF THE DRAWINGS

FIG. 7 is a process cross-sectional view which illustrates the process sequence in a manufacturing method for a semiconductor memory device according to the second embodiment of the present invention, which corresponds to the cross-sectional view as cut along the line A–A' of FIG. 5.

Figure 1:
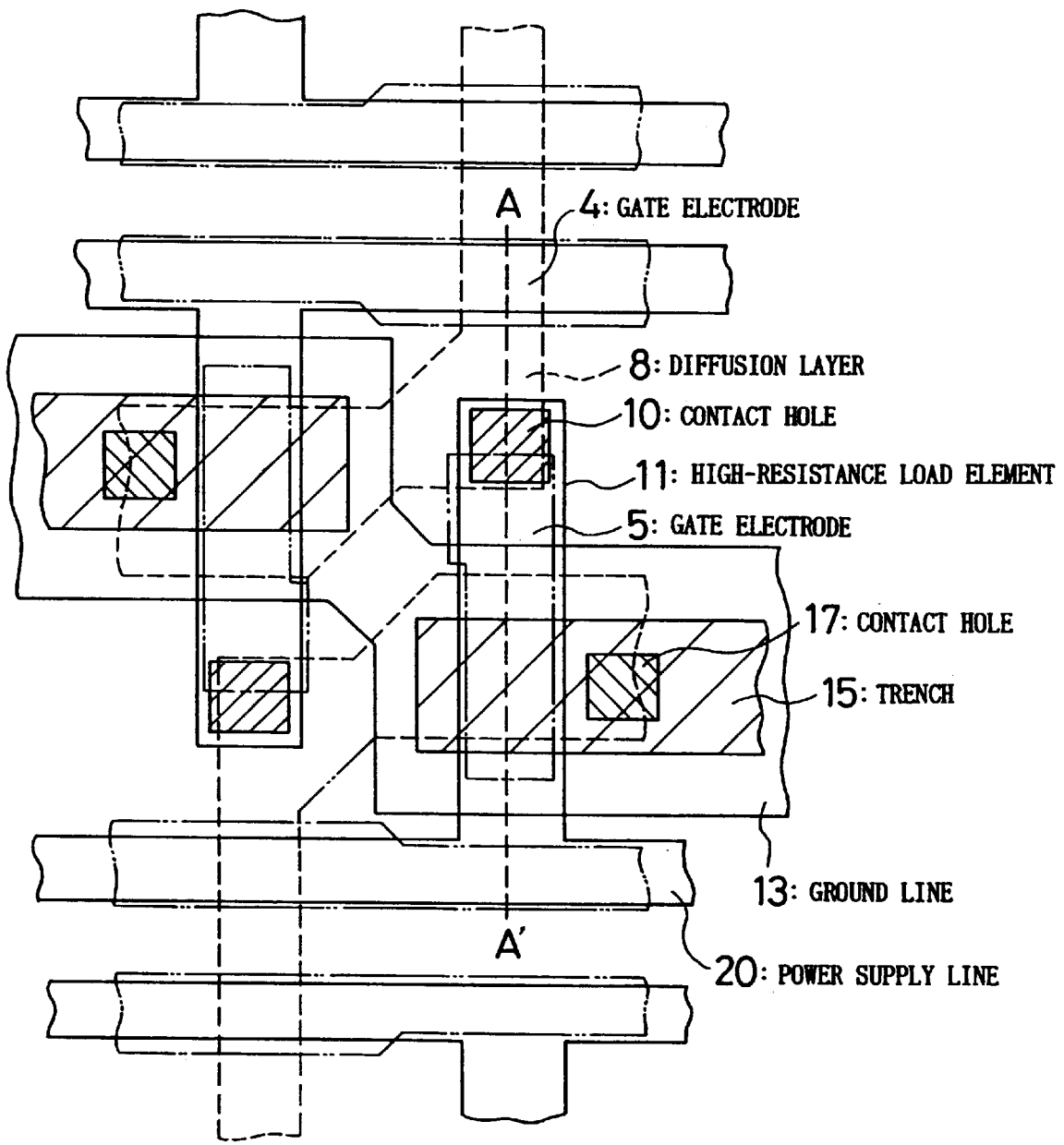
FIG. 1 is a plan view of a semiconductor memory device according to the first embodiment of the present invention.

DETAILED DESCRIPTION OF THE PREFERRED EMBODIMENTS:

The preferred embodiment of the present invention will be explained hereunder with reference to the attached drawings.

As mentioned above, one embodiment of the present invention is a method of manufacturing a semiconductor device according to the present invention is a method of manufacturing a semiconductor memory device that has a plurality of static memory cells formed from two MOS driver transistors, which are formed on a semiconductor substrate, two MOS transfer transistors and two load elements, which are connected to the drains of the above-noted two MOS driver transistors, and a power supply line, which supplies a power supply voltage, this manufacturing method including a step (a) of forming a field insulation layer onto the surface of the above-noted semiconductor substrate and then forming a gate insulation layer, a step (b) of forming a first conductive layer and then etching a prescribed region so as to form the above-noted MOS driver transistors and above-noted MOS transfer transistors, a step (c) of forming a first interlayer insulation layer, a step (d) of forming a second conductive layer and a silicon nitride layer over the above-noted first interlayer insulating layer and then etching the above-noted second conductive layer and silicon nitride layer in a prescribed shape, a step (e) of forming a second interlayer insulation layer over the above, a step of etching said first and second interlayer insulation layers over said silicon nitride layer and a node portion to form a trench therein; a step (f) of etching the above-noted second interlayer insulation layer over the above-noted silicon nitride layer to form a trench therein, and a step (g) of forming a third conductive layer and patterning a prescribed shape thereonto.

The present invention includes a high-resistance load element that may preferably be formed by polysilicon as the third conductive layer.

The present invention also includes a step forming a first insulation layer after patterning the above-noted third conductive layer, and a step of patterning a fourth conductive layer after forming an aperture as a contact hole in a prescribed region, so as to expose the second conductive layer, i.e., the patterned ground line.

The present invention additionally includes the case in which the first insulation layer may preferably be a silicon oxide layer or a compound layer of a silicon oxide layer and a silicon nitride layer.

The present invention is additionally a method of manufacturing a semiconductor memory device that has a static memory cell that include two MOS driver transistors, which are formed on a semiconductor substrate, two MOS transfer transistors and two load elements, which are connected to the drains of the above-noted two MOS driver transistors, and a power supply line, that supplies a power supply voltage, this manufacturing method including a step of forming a field insulation layer onto the surface of the semiconductor substrate and then forming a gate insulation layer, a step of forming a first conductive layer and then etching a prescribed region so as to form the above-noted MOS driver transistors and above-noted MOS transfer transistors, a step of forming a first interlayer insulation layer, a step of forming a second interlayer insulation layer, a step of forming a first contact hole, which exposes a part of said gate electrode of said drive MOS transistor and at least a part of said diffusion layer formed on said semiconductor substrate in a prescribed region, a step of forming and patterning a third conductive layer, a step of forming a first insulation layer, a step of forming a second contact hole, which exposes a part of said gate electrode of said drive MOS transistor and at least a part of said diffusion layer formed on said semiconductor substrate in a prescribed region, and a step of forming a fourth conductive layer and patterning so that there is overlap with part of the third conductive layer.

The present invention includes a high-resistance, load element that is formed by polysilicon as the third and fourth conductive layers.

The present invention also includes the connection of the third and fourth conductive layers to a ground line at the time of patterning, and the formation of a capacitor that have the third and fourth conductive layers, respectively, as opposing electrodes.

The present invention additionally includes the case in which the first insulation layer is a silicon oxide layer or a compound layer of a silicon oxide layer and a silicon nitride layer.

According to an embodiment of the present invention, it is possible to achieve a sufficient resistance length and also to achieve an increase the node resistance, without making the process complex.

Figure 11:
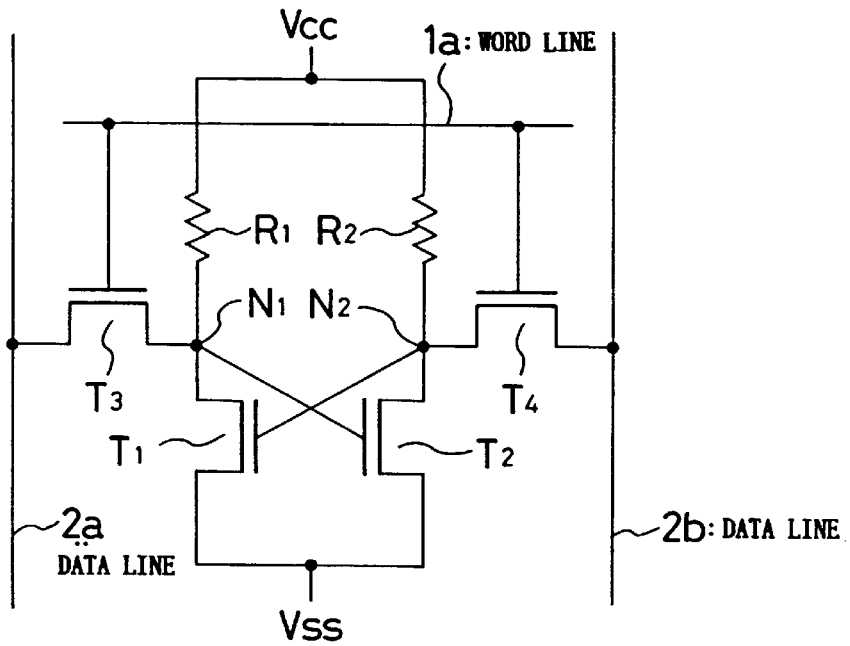
FIG. 11 is a drawing which shows an equivalent circuit of a static memory cell.
Figure 12:
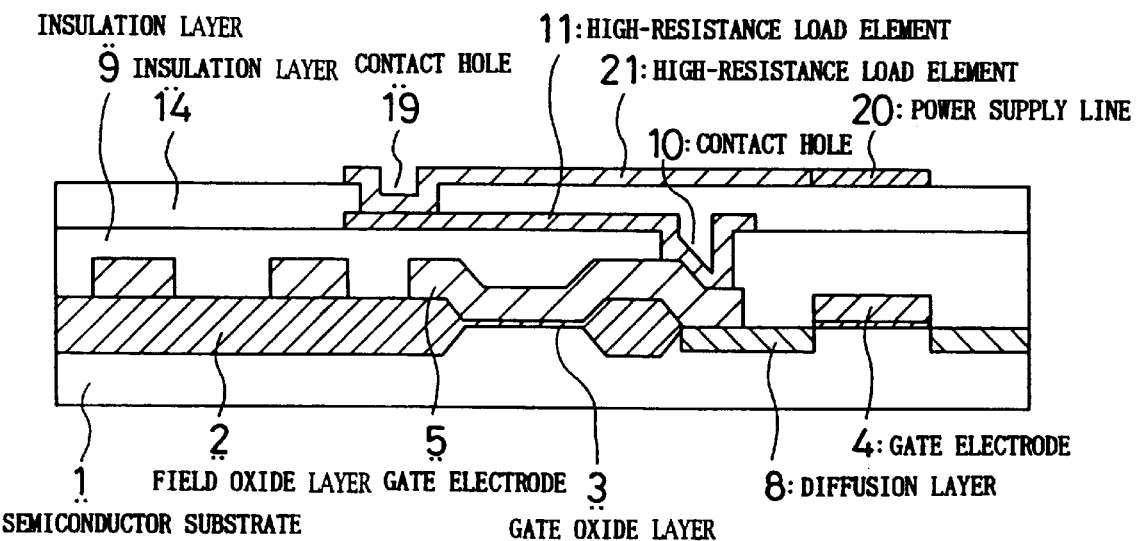
FIG. 12 is a vertical cross-sectional view of a semiconductor memory device of the past.

Embodiments of present invention will be described below, with reference being made to the relevant accompanying drawings. The equivalent circuit which is shown in FIG. 11 is applied as is to the embodiments of the present invention as well.

Figure 2:
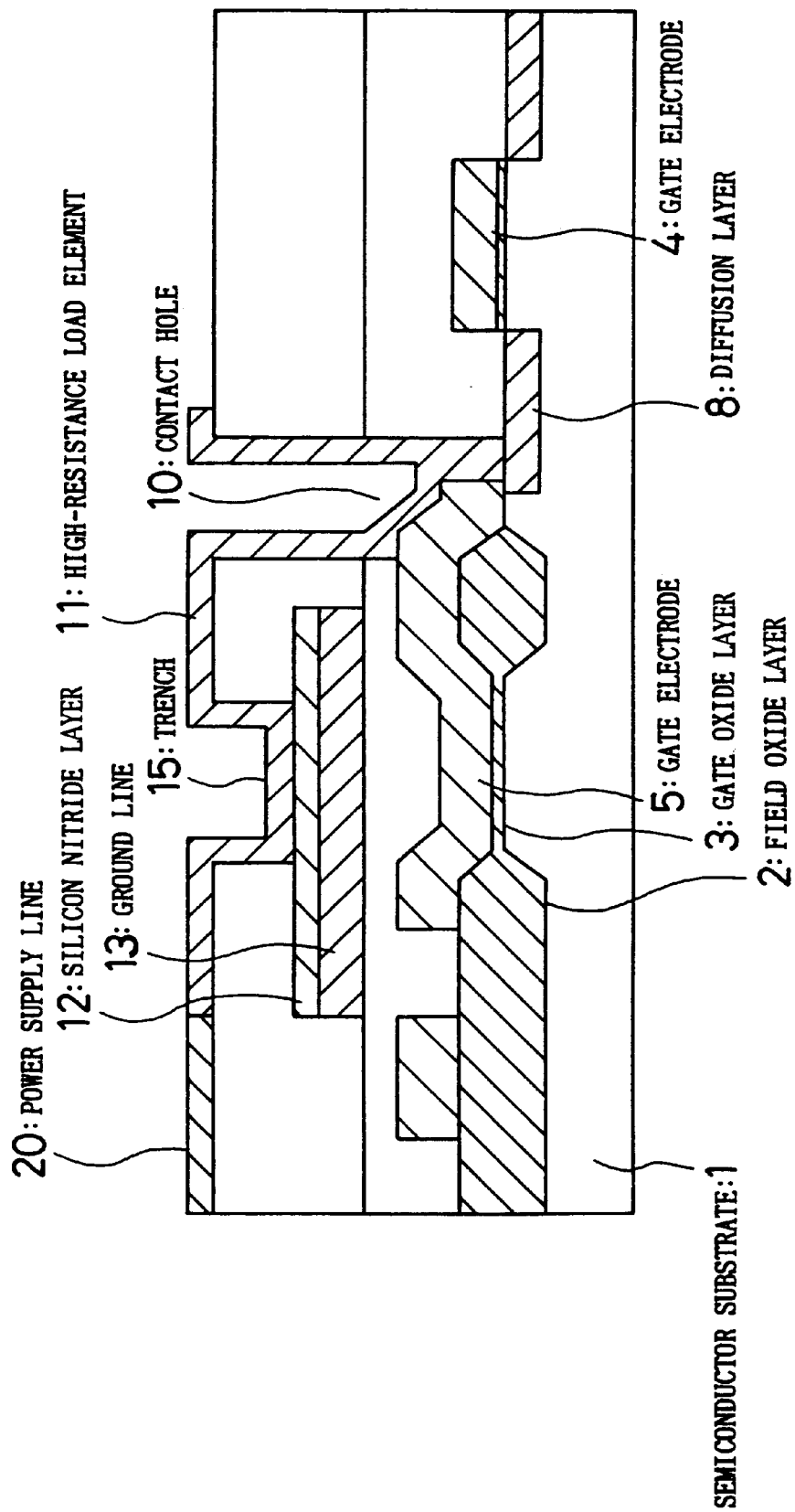
FIG. 2 is a vertical cross-sectional view along the direction indicated by the line A–A' in FIG. 1.

FIG. 1 is a plan view of an SRAM cell for the purpose of illustrating an embodiment of the present invention, and FIG. 2 is a vertical cross-sectional view along the direction of the line A–A' of FIG. 1.

Referring to FIG. 1 and FIG. 2, in this embodiment, by means of a conductive layer of polysilicon or the like which is formed on top of the semiconductor substrate, the gate electrodes 4 of the MOS transfer transistors and the gate electrodes 5 of the MOS driver transistors are formed.

Each of the MOS transistors are electrically separated by the field oxide layer 2. The high-resistance load elements 11 and the gate electrodes of the MOS driver transistors are connected with the diffusion layer 8 of the MOS transfer transistors via the contact hole 10.

Additionally, the high-resistance load element 11 is formed in a trench 15 formed in the top of the ground line (Vss), a high-resistance being masked by photoresist in the end part, so as to form a power supply line 20 by ion implantation of a high-concentration impurity.

FIG. 3 is a process cross-sectional view which illustrates the process sequence in a method of manufacturing an embodiment of an SRAM memory cell according to the present invention.

An embodiment of the manufacturing method according to the present invention will be described in terms of FIG. 3.

A field oxide layer 2 having a thickness of 100 to 500 nm is formed on the semiconductor substrate 1, using the recess LOCOS method or the like, and additionally a gate oxide layer 3 having a thickness of 5 to 20 nm is formed thereonto.

Next, a conductive layer of polysilicon or the like having a thickness of 100 to 300 nm is formed for the purpose of forming the gate electrodes of the MOS driver transistors.

Next, photolithography and etching are done to generate a pattern of a prescribed shape, so as to form the gate electrodes 5 of the MOS driver transistors and the gate electrodes 4 of the MOS transfer transistors.

Next, in order to form the source and drain parts of the transistors, a diffusion layer 8 is formed by implanting arsenic to a dose of $1 \times 10^{15}$.

Figure 3A:
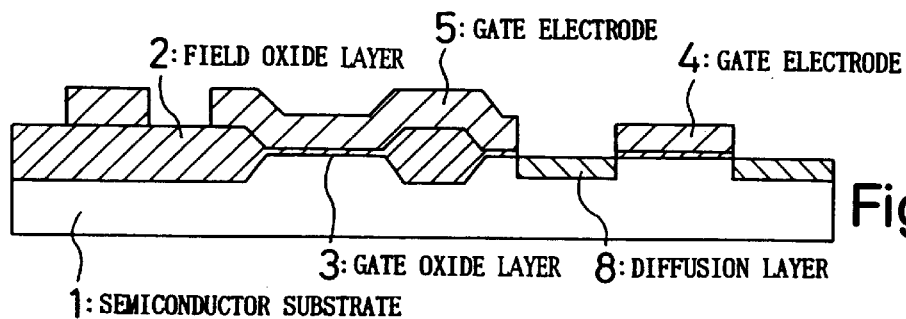
FIG. 3 is a process cross-sectional view which illustrates the process sequence in a manufacturing method for a semiconductor memory device according to the first embodiment of the present invention, which corresponds to the cross-sectional view as cut along the line A–A' of FIG. 1.

The above steps result in the formation of the cross-section which is shown in FIG. 3(a).

Next, after forming a first interlayer insulation layer 9 and thereafter forming the contact holes (not shown in the drawing) for the purpose of making connection between the sources of the MOS driver transistors and the ground line, a conductor layer 13 such as polysilicon or tungsten silicide is formed as the ground line layer to a thickness of 100 to 200 nm.

Figure 3B:
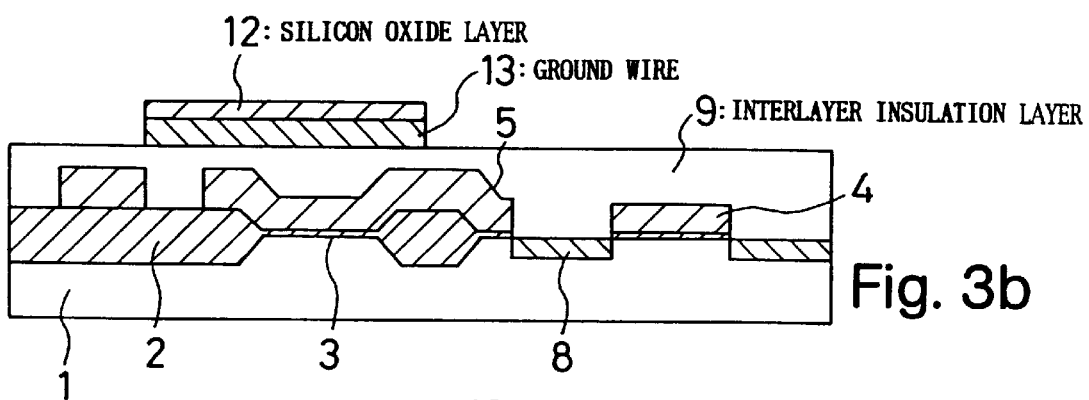

Over the above-noted structure a layer of silicon nitride is formed to a thickness of 100 to 120 nm, photolithography and etching are done to achieve a pattern of a prescribed shape, so as to form the ground line 13 (refer to FIG. 3(b).

Figure 3C:
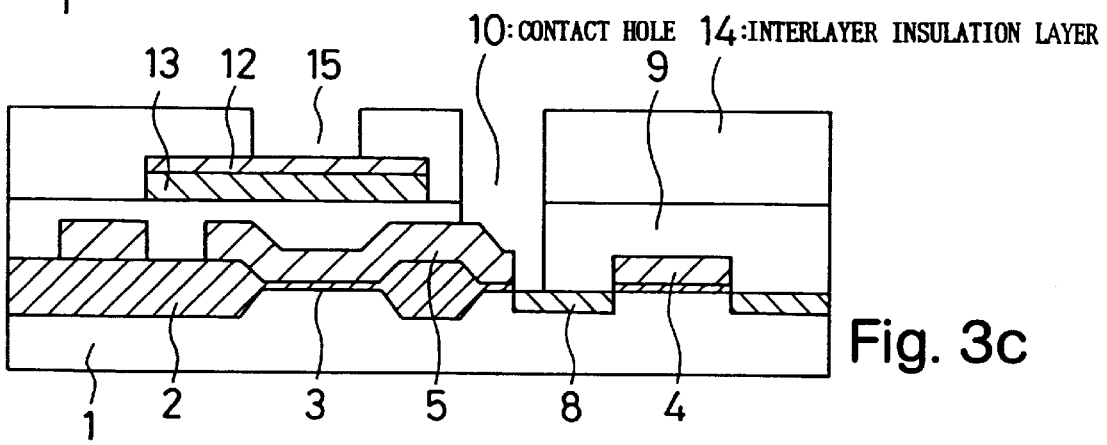

Next, a planalized interlayer insulation layer 14 is formed to a thickness of 300 to 500 nm, photolithography is used form a pattern thereon of a prescribed shape, and the interlayer insulation layers 9 and 14 are etched under oxide layer etching in an atmosphere of CO and CH gas, which provides a high selectivity with respect to nitride layer, thereby forming the trench 15 and the contact hole 10 (refer to FIG. 3(c)).

Next, polysilicon to a thickness of 50 to 150 nm is formed for the purpose of forming the high-resistance load elements, this being patterned to achieve a prescribed shape, thereby forming the high-resistance load elements 11.

Figure 3D:
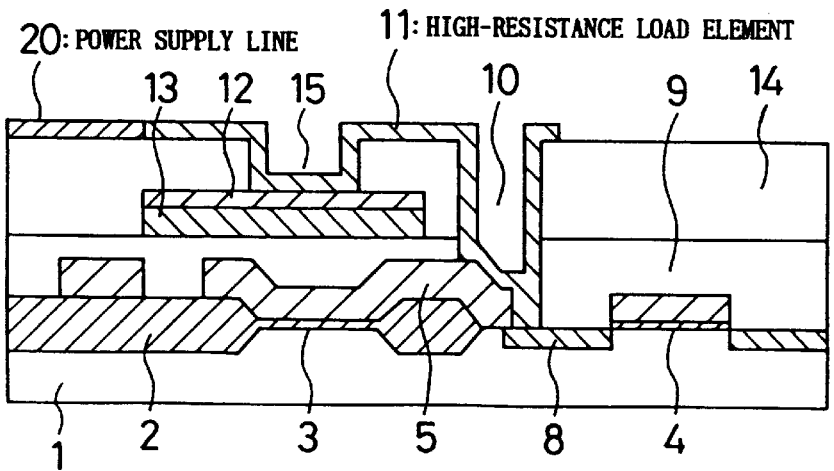

Additionally, the high-resistance parts of the high-resistance load elements 11 are masked using photolithography, ion implantation of a p-type impurity being done to a dose of $1\times10^{16}$ being done to form the power supply line 20 (refer to FIG. 3(d)).

According to the above-described manufacturing method, because it is possible to make the step in the side wall of the trench 15 long, even if the cell is made smaller, it is possible to form a high-resistance load element having a stable resistance value.

As apparent from FIG. 3, the semiconductor device of the present invention has a special configuration as follows;

Note that a semiconductor memory device of the present invention has a static type memory cell, which includes two MOS driver transistors, which are formed on a semiconductor substrate, two MOS transfer transistors and two high-resistance load elements, which are connected to the drains of each one of the two MOS driver transistors, respectively, and a power supply line, which supplies a power supply voltage, and wherein the device comprises a substrate on which at least field oxide layers, gate electrodes and diffusion layers are formed, a first interlayer insulation layer, which is formed on the substrate, a patterned ground line that is formed on the first interlayer insulation layer, a surface thereof being covered with an etching stopping layer, a second interlayer insulation layer, which is formed on the first interlayer insulation layer, so as to cover the patterned ground line and foregoing elements and having a trench being formed therein so as to extend to the the etching stopping layer by penetrating through the second interlayer insulation layer, and a high-resistance load element layer being deposited onto a surface of the second interlayer insulation layer and inside surface of the trench.

The semiconductor memory device of the present invention may further comprises a second interlayer insulation layer being provided with a contact hole extended from a top surface thereof to a portion where the gate electrode and the diffusion layer exist by penetrating the first and second interlayer insulation layers and the second interlayer insulation layer is also formed inside surface of the contact hole so that the second interlayer insulation layer is connected to both of the gate electrode and the diffusion layer.

FIG. 4 is a vertical cross-sectional view which illustrates the second embodiment of the present invention.

Figure 4A:
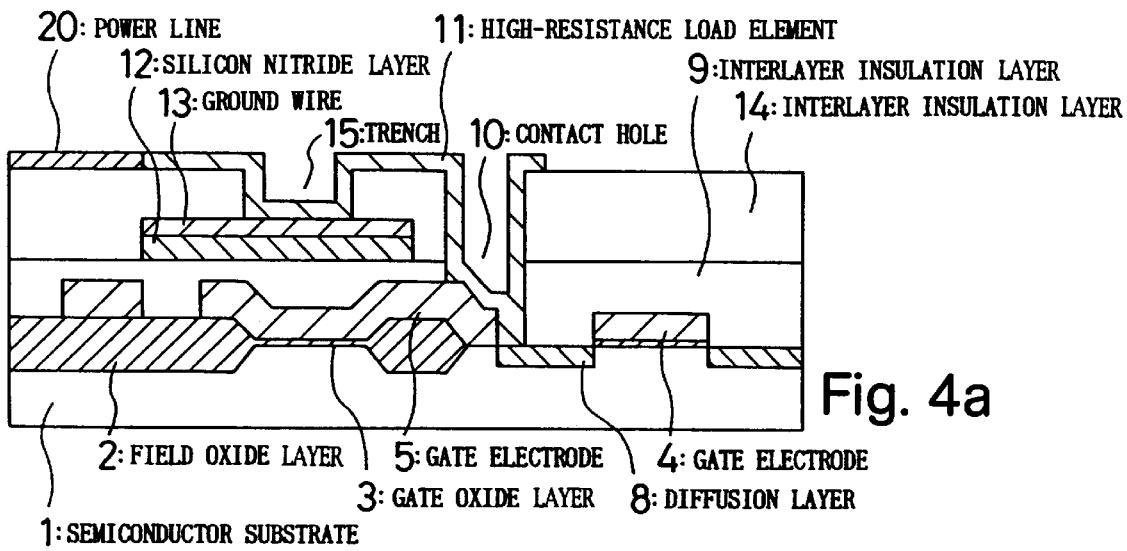
FIG. 4 is a process cross-sectional view which illustrates the process sequence in a manufacturing method for a semiconductor memory according to the second embodiment of the present invention.

FIG. 4(a) shows the condition up to the point at which the high-resistance load elements 11 and power supply line 20 is formed, in the same manner as described with regard to the first embodiment.

Next, a silicon oxide layer or a two-layer layer formed by a silicon nitride layer and a silicon oxide layer is formed to a thickness of approximately 10 nm.

Figure 4B:
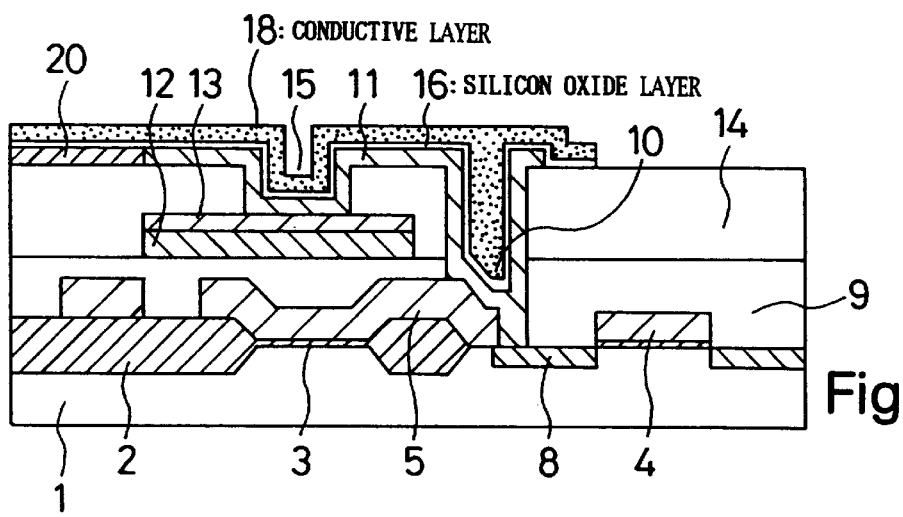

Then, after forming a contact hole 17 (refer to FIG. 1) leading up to the ground line 13, polysilicon is formed to a thickness of 50 to 200 nm, ion implantation is done to a dose of $1\times10^{16}$ cm$^{-2}$ or so with an n-type impurity such as phosphorus, thereby forming the conductive layer 18 (refer to FIG. 4(b)).

In this embodiment, it is possible to make a capacitive element having a value of 5 to 20 fF, making use of the high-resistance load elements 11 connected to the node and, because the electrostatic capacitance at the step part of the side wall of the trench 15 can be increased even further, it is possible to improve the alpha ray immunity of the memory cell.

As mentioned above, the semiconductor memory device of the second embodiment of the present invention may further comprise an insulation layer formed on a surface of the second interlayer insulation layer and a conductive layer formed on a surface of the insulation layer.

Additionally, the semiconductor memory device of the present invention may further comprise an insulation layer formed on a surface of the second interlayer insulation layer and a conductive layer formed on a surface of the insulation layer.

Figure 5:
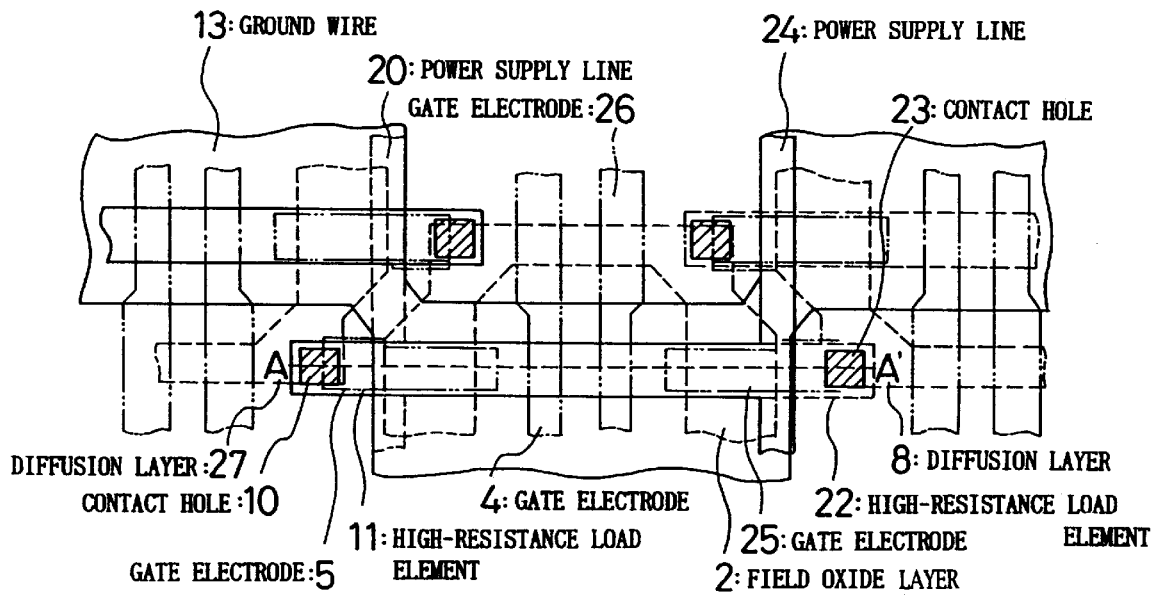
FIG. 5 is a plan view of a semiconductor memory device according to the third embodiment of the present invention.
Figure 6:
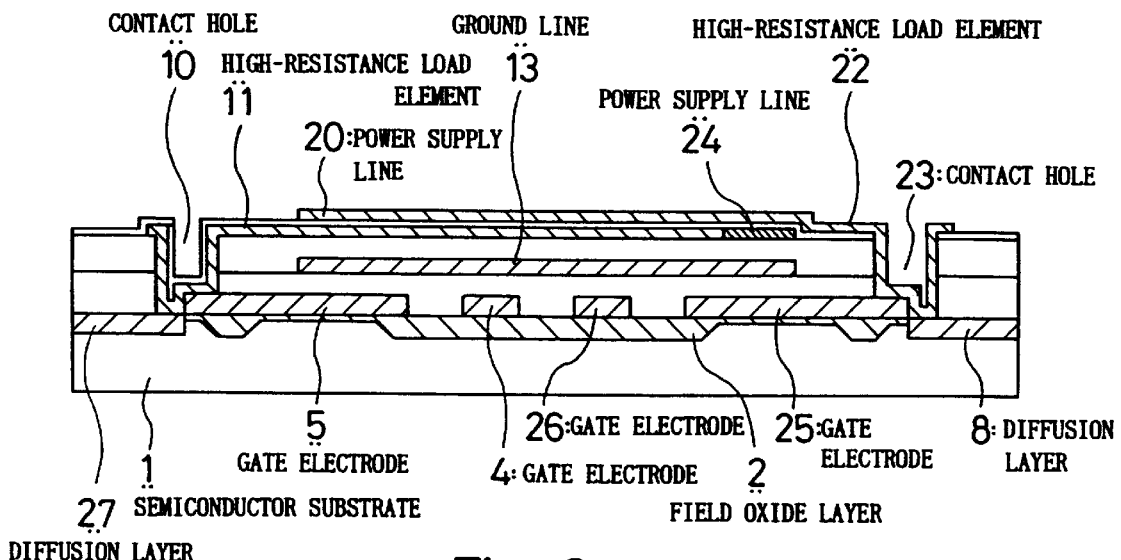
FIG. 6 is a vertical cross-sectional view along the line A–A' of FIG. 5.

FIG. 5 is a plan view of an SRAM cell presented to illustrate the third embodiment of the present invention, and FIG. 6 is a vertical cross-sectional view thereof, along the line A–A' which is indicated in FIG. 5.

Referring to FIG. 5 and FIG. 6, in this embodiment, by means of a conductive layer of polysilicon or the like formed on the semiconductor substrate 1, the gate electrodes 4 and 26, which serve as both the MOS transfer transistors and the word line, and the gate electrodes 5 and 25 of the MOS driver transistors are formed.

Each of the MOS transistors are electrically separated by the field oxide layer 2. The high-resistance load elements 11 and 22 and the gate electrode 5 of the driver transistors are connected with the diffusion layer 8 of the MOS transfer transistors via the contact holes 10 and 23.

Additionally, the high-resistance load elements 11 and 22 are formed on top of the ground line 13, a high-resistance being masked by photoresist in the end part thereof, so as to form the power supply lines 20 and 24 by ion implantation of a high-concentration impurity.

FIG. 7 is a process sequence cross-sectional view which illustrates the process sequence in a method of manufacturing an SRAM memory cell according to the third embodiment of the present invention.

The method of manufacturing according to the third embodiment of the present invention will be described with reference being made to FIG. 7.

A field oxide layer 2 having a thickness of 100 to 500 nm is formed on the semiconductor substrate 1, using the recess LOCOS method or the like, and additionally a gate oxide layer 3 having a thickness of 5 to 20 nm is formed thereonto.

Next, a conductive layer of polysilicon or the like having a thickness of 100 to 300 nm is formed for the purpose of forming the gate electrodes of the MOS driver transistors.

Next, photolithography and etching are done to generate a pattern of a prescribed shape, so as to form the gate electrodes 5 and 25 of the MOS driver transistors and the gate electrodes 4 and 26 of the MOS transfer transistors.

Next, in order to form the source and drain parts of the transistors, a diffusion layer 8 is formed by implanting arsenic to a dose of $1\times10^{15}$ cm$^{-2}$.

Next, after forming the contact holes (not shown in the drawing) for the purpose of making connection between the sources of the MOS driver transistors and the ground line, a conductor layer 13 such as polysilicon or tungsten silicide is formed as the ground line layer to a thickness of 100 to 200 nm.

Next, photolithography and etching are done to achieve a pattern of a prescribed shape, so as to form the ground line 13 (refer to FIG. 7(a)).

Next, a flattened interlayer insulation layer 14 is formed to a thickness of 300 to 500 nm, photolithography is used form a pattern thereon of a prescribed shape, and the interlayer insulation layers 9 and 14 are etched, forming a contact hole 10, and forming polysilicon 28 to a thickness of 50 to 150 nm for the purpose of forming the high-resistance load elements (refer to FIG. 7(b)).

Next, after patterning to achieve a prescribed shape, thereby forming the high-resistance load elements 11, the high-resistance part of the high-resistance load elements 11 are masked using photolithography, ion implantation of a p-type impurity being done to a dose of $1\times10^{16} cm^{-2}$ being done to form the power supply line 24.

Additionally, a silicon oxide layer 29 is formed to a thickness of 10 to 100 nm (refer to FIG. 7(c)).

Next, photolithography is used to pattern a prescribed region, the interlayer insulation layers 9 and 14 are etched, the contact hole 23 is formed, and a polysilicon layer of 50 to 150 nm for the purpose of forming the high-resistance load elements is formed, after which a prescribed shape is patterned, so as to form the high-resistance load element 22.

Next, photolithography is used to mask a high-resistance part of the high-resistance load element 22, ion implantation of a p-type impurity being done to a dose of $1\times10^{16} cm^{-2}$ being done to form the power supply line 20.

According to the above-described manufacturing method, because it is possible to attain a length for two cells, it is possible to form a high-resistance load element having a stable resistance value.

In accordance with the third embodiment of the present invention, the semiconductor memory device has a configuration as shown in FIG. 5, in that the device includes two MOS driver transistors, which are formed on a semiconductor substrate, two MOS transfer transistors and two high-resistance load elements, which are connected to the drains of each one of the two MOS driver transistors, respectively, and a power supply line, which supplies a power supply voltage, wherein the device comprises a substrate on which at least field oxide layers, gate electrodes and diffusion layers are formed, a first interlayer insulation layer, which is formed on the substrate, a patterned ground line that is formed on the first interlayer insulation layer, a second interlayer insulation layer, which is formed on the first interlayer insulation layer, so as to cover the patterned ground line and foregoing elements, at least a first and second contact holes being provided at both sides of the patterned ground line and each of which being extended from a top surface thereof to a portion where the gate electrode and the diffusion layer exist by penetrating the first and second interlayer insulation layers, a first high-resistance load element being formed on a surface of the second interlayer insulation layer and on an inside surface of the first contact hole, and a second high-resistance load element being formed on a surface of the first high-resistance load element with interposing an insulation layer.

Figure 8:
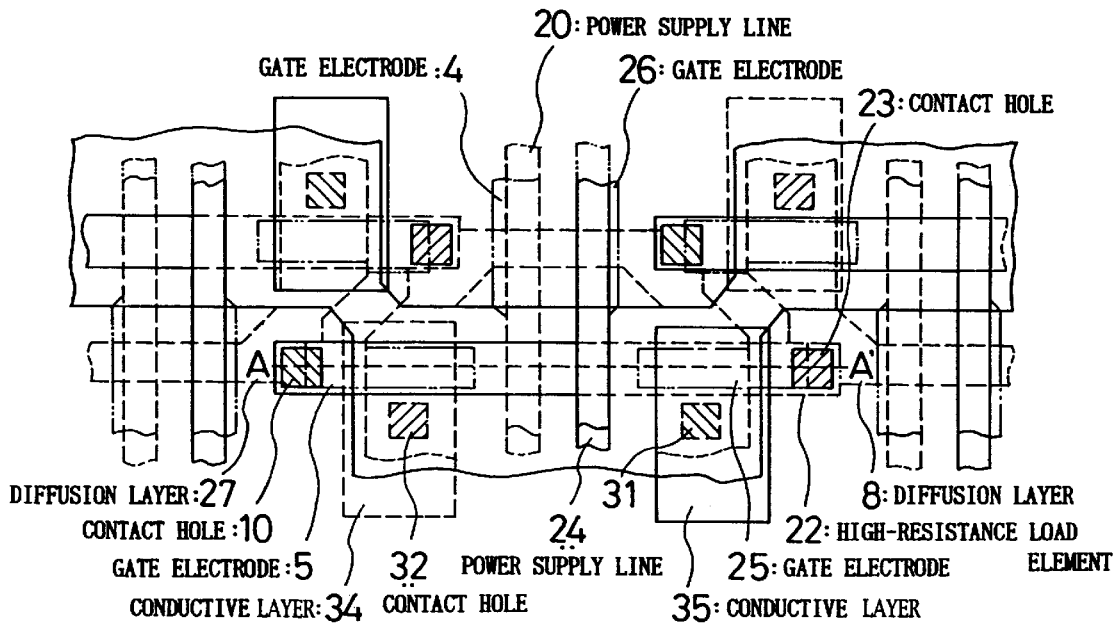
FIG. 8 is a plan view of a semiconductor memory device according to the fourth embodiment of the present invention.
Figure 9:
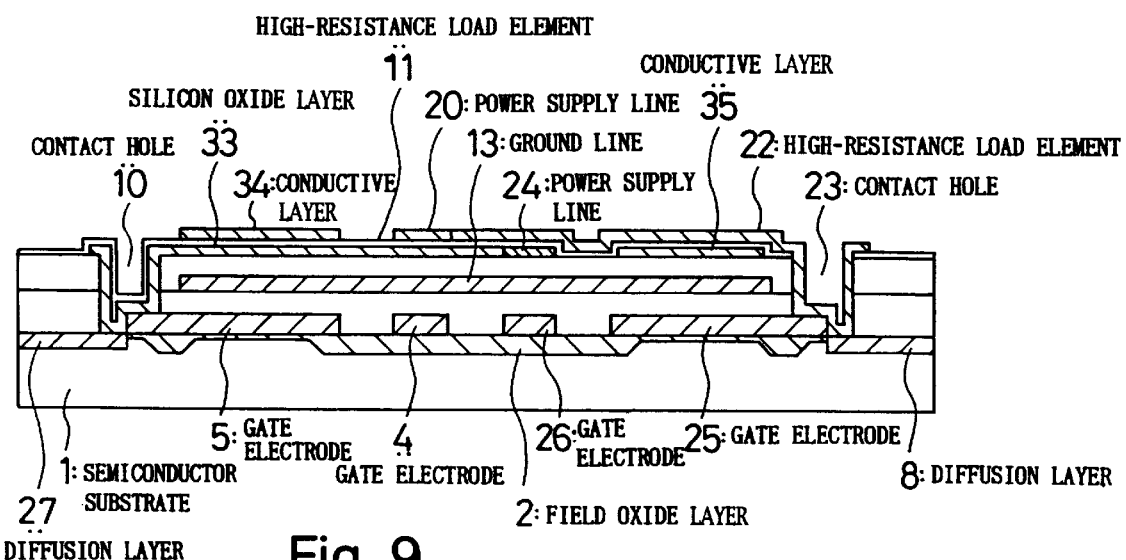
FIG. 9 is a vertical cross-sectional view along the line A–A' of FIG. 8.

FIG. 8 is a plan view of an SRAM cell which illustrates the fourth embodiment of the present invention, and FIG. 9 is a vertical cross-sectional view in the direction of the line A–A' which is indicated in FIG. 8.

Referring to FIG. 8 and FIG. 9, by forming a layer of polysilicon or the like on the semiconductor substrate 1 as a conductive layer, the gate electrodes 4 and 26, which serve as both the MOS transfer transistors and the word line, and the gate electrodes 5 and 25 of the MOS driver transistors are formed.

Each of the MOS transistors are electrically separated by the field oxide layer 2. The high-resistance load elements 11 and 22 and the gate electrode 5 and 25 of the driver transistors are connected with the diffusion layer 8 of the MOS transfer transistors via the contact holes 10 and 23.

Additionally, the high-resistance load elements 11 and 22 are formed on top of the ground line (VSS) 13, a high-resistance being masked by photoresist in the end part thereof, so a to form the power supply lines 20 and 24 by ion implantation of a high-concentration impurity.

Additionally, there is a capacitive element that is formed by the conductive layers 34 and 35, which are at ground potential, and the high-resistance load elements 11 and 22, which are connected to the node.

FIG. 10 is a process cross-sectional view which illustrates the process sequence of a method of manufacturing an SRAM memory cell according to the fourth embodiment of the present invention.

A field oxide layer 2 having a thickness of 100 to 500 nm is formed on the semiconductor substrate 1, using the recess LOCOS method or the like, and additionally a gate oxide layer 3 having a thickness of 5 to 20 nm is formed thereonto.

Next, a conductive layer of polysilicon or the like having a thickness of 100 to 300 nm is formed for the purpose of forming the gate electrodes of the MOS driver transistors.

Next, photolithography and etching are done to generate a pattern of a prescribed shape, so as to form the gate electrodes 5 and 25 of the MOS driver transistors and the gate electrodes 4 and 26 of the MOS transfer transistors.

Next, in order to form the source and drain parts of the transistors, a diffusion layer 8 is formed by implanting arsenic to a dose of $1\times10^{15} cm^{-2}$.

Next, after forming the contact holes (not shown in the drawing) for the purpose of making connection between the sources of the MOS driver transistors and the ground line, a conductor layer 13 such as polysilicon or tungsten silicide is formed as the ground line layer to a thickness of 100 to 200 nm.

Figure 10A:
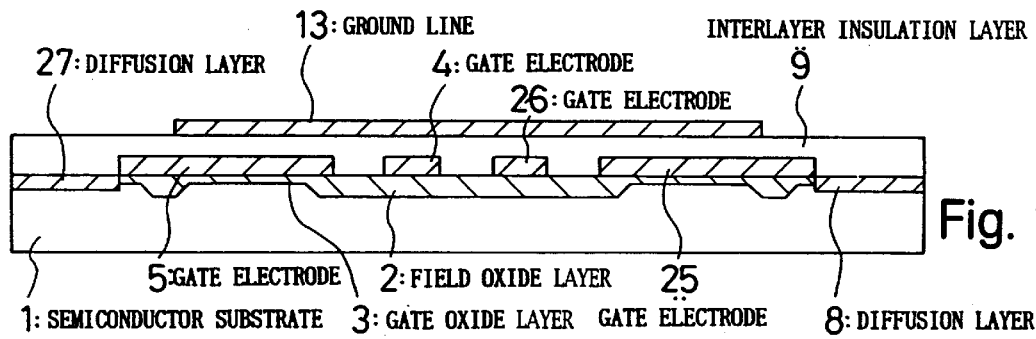
FIG. 10 is a process cross-sectional view which illustrates the process sequence in a manufacturing method for a semiconductor memory device according to the fourth embodiment of the present invention, which corresponds to the cross-sectional view as cut along the line A–A' of FIG. 8.

Next, photolithography and etching are done to achieve a pattern of a prescribed shape, so as to form the ground line 13 (refer to FIG. 10(a)).

Figure 10B:
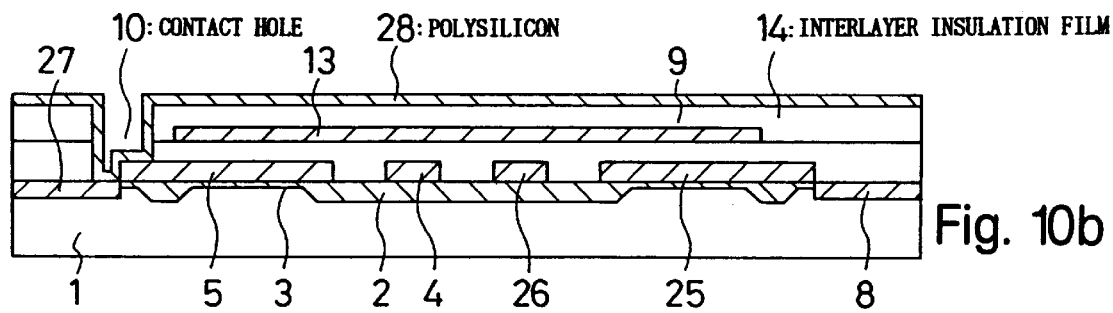

Next, a flattened interlayer insulation layer 14 is formed to a thickness of 300 to 500 nm, photolithography is used form a pattern thereon of a prescribed shape, and the interlayer insulation layers 9 and 14 are etched, forming a contact hole 31 up to the ground line 13 (refer to FIG. 8), and forming polysilicon 28 to a thickness of 50 to 150 nm for the purpose of forming the high-resistance load elements 11 (refer to FIG. 10(b)).

Next, after patterning to achieve a prescribed shape, thereby forming the high-resistance load elements 11, the high-resistance part of the high-resistance load elements 11 are masked using photolithography, ion implantation of a p-type impurity being done to a high-concentration dose of approximately $1\times10^{16} cm^{-2}$ being done to form the power supply line 24.

Figure 10C:
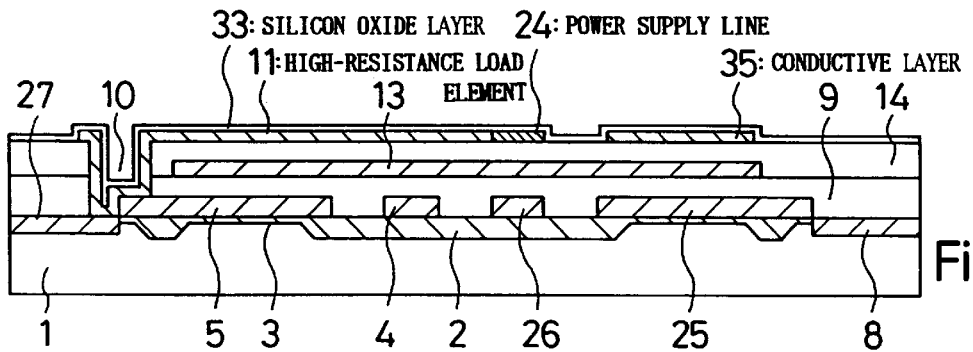

Next, a silicon oxide layer 33 or a two-layer layer formed of a silicon nitride layer and a silicon oxide layer is formed to a thickness of 10 nm (refer to FIG. 10(c)).

Then, photolithography is used to pattern a prescribed region, the interlayer insulation layers 9 and 14 are etched, the contact hole 23 and a contact hole 32 up to the ground wire 13 are formed (refer to FIG. 8).

Then, polysilicon to a thickness of 50 to 150 for the purpose of forming the high-resistance load element 22 and the conductive layer 34 is formed, patterning is done to a prescribed shape, so as to form the high-resistance load element 22.

Figure 10D:
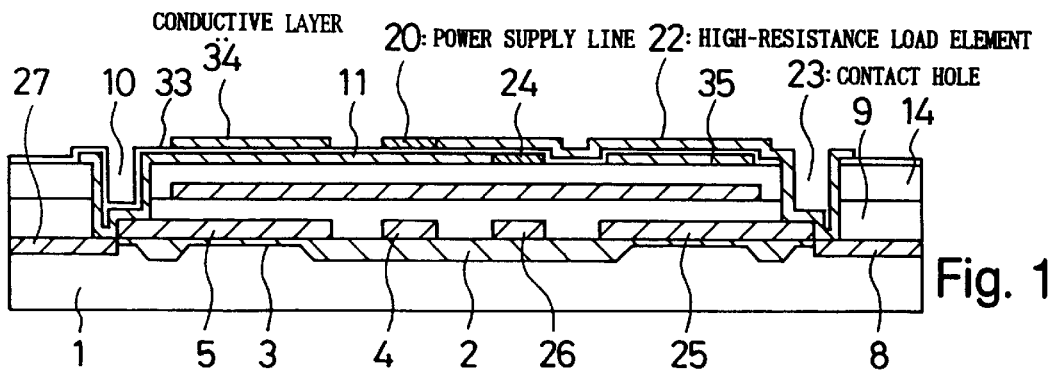

Then, the high-resistance part of the high-resistance load element 22 is masked by photolithography, ion implantation of a p-type impurity being done to a dose of $1\times10^{18}$ cm$^{-2}$ being done to form the power supply line 20 and the conductive layer 34 (refer to FIG. 10(d)).

In the fourth embodiment of the present invention, in addition to the ability to make the resistance length long, by forming capacitive elements with the high-resistance load elements 11 and 22, which are connected to the node parts of the conductive layers 34 and 35, respectively, it is possible to achieve a capacitance of 5 to 20 fF, thereby improving the alpha-ray immunity of the memory cell.

The configuration of the semiconductor memory device according to the fourth embodiment of the present invention, shows that a first conductive layer being further provided on the surface of the second interlayer insulation layer, and a second conductive layer being further provided on the surface of the insulation layer.

As described in detail above, the present invention provides the following effects.

Firstly, even if the cell is made small, it enables the establishment of a sufficiently long resistance. The reason for this is that, in the present invention, the high-resistance element is formed with two layers in two steps.

Secondly, the present invention facilitates the patterning of the high-resistance elements. The reason for this is that, in the present invention, the high-resistance element is formed with two layers in two steps.

Thirdly, the present invention enables an improvement in the alpha-ray immunity of the memory cell even in the case of a high degree of integration. The reason for this is that, in the present invention, a high-resistance load element is used as a means of increasing the Node capacitance.

What is claimed:

1. A method for manufacturing a semiconductor memory device that has a plurality of static type memory cells which include two MOS driver transistors, which are formed on a semiconductor substrate, two MOS transfer transistors and two load elements, which are connected to the drains of said two MOS driver transistors, and a power supply line, which supplies a power supply voltage, said manufacturing method comprising steps of:
    (a) forming a field insulation layer onto the surface of said semiconductor substrate and then forming a gate insulation layer;
    (b) forming a first conductive layer and then etching a prescribed region so as to form said MOS driver transistors and said MOS transfer transistors;
    (c) forming a first interlayer insulation layer;
    (d) forming a second conductive layer and a silicon nitride layer over said first interlayer insulating layer and then etching said second conductive layer and said silicon nitride layer in a prescribed shape;
    (e) forming a second interlayer insulation layer thereover;
    (f) etching said second interlayer insulation layer over said silicon nitride layer to form a trench therein and etching said first and second interlayer insulation layers over a node portion; and
    (g) forming a third conductive layer and patterning a prescribed shape thereonto.

2. A method of manufacturing a semiconductor device according to claim 1, wherein said third conductive layer is polysilicon.

3. A method of manufacturing a semiconductor device according to claim 1, wherein, after patterning is done so as to form third conductive layer, patterning is done to form a first insulation layer and a separate patterning is done to form a fourth conductive layer, which serves as a capacitor which has as an opposing electrode said third conductive layer.

4. A method of manufacturing a semiconductor device according to claim 3, wherein said first insulation layer is selected from a group consisting of a single silicon oxide layer and a compound layer made up of a silicon oxide layer and a silicon nitride layer.

5. A method of manufacturing a semiconductor memory device that has a plurality of static memory cells, which include two MOS driver transistors, which are formed on a semiconductor substrate provided with gate electrodes and diffusion layers, two MOS transfer transistors and two load elements, which are connected to the drains of said two MOS driver transistors, and a power supply line, that supplies a power supply voltage, said manufacturing method comprising steps of:
    (a) forming diffusion layers and a field insulation layer on a surface of said semiconductor substrate and then forming a gate insulation layer and gate electrodes;
    (b) forming a first conductive layer and then etching a prescribed region thereof so as to form said MOS driver transistors and said MOS transfer transistors;
    (c) forming a first interlayer insulation layer and a second conductive layer and then patterning the second conductive layer to form a ground line;
    (d) forming a second interlayer insulation layer;
    (e) forming a first contact hole, which exposes a part of said gate electrode of said driver transistor and at least a part of said diffusion layer formed on said semiconductor substrate in a prescribed region;
    (f) forming and patterning a third conductive layer;
    (g) forming a first insulation layer;
    (h) forming a second contact hole, which exposes a part of said gate electrode of said driver transistor and at least a part of said diffusion layer formed on said semiconductor substrate in a prescribed region;
    (i) forming a fourth conductive layer and patterning so that there is overlap with part of the third conductive layer;
    (j) forming a fifth conductive layer connected to a ground line on said second interlayer insulation layer at the time when said third conductive layer is formed; and
    (k) forming a sixth conductive layer connected to a ground line on said first insulation layer at the time when said fourth conductive layer is formed.

6. A method of manufacturing a semiconductor memory device that has a plurality of static memory cells, which include two MOS driver transistors, which are formed on a semiconductor substrate, two MOS transfer transistors and two load elements, which are connected to the drains of said two MOS driver transistors, and a power supply line, which supplies a power supply voltage, said manufacturing method comprising steps of:
    (a) forming a field oxide layer and forming a gate electrode, and then forming a first interlayer insulation layer thereover;
    (b) depositing a conductive layer and an etching stopping layer onto said first interlayer insulation layer and forming these layers by patterning;
    (c) forming a second interlayer insulation layer thereonto and forming a trench that extends to said etching stopping layer thereof; and (d) depositing a high-resistance load element layer thereonto and forming said layer by patterning, so that the resistance length is increased by an amount of a step of a sidewall of said trench.

7. A method of manufacturing a semiconductor memory device that has a plurality of static memory cells, which include two MOS driver transistors, which are formed on a semiconductor substrate, two MOS transfer transistors and two high-resistance load elements, which are connected to the drains of said two MOS driver transistors by a common contact, and a power supply line, which supplies a power supply voltage, said manufacturing method comprising steps of:

(a) forming a field oxide layer and a gate electrode on said substrate, then forming a first interlayer insulation layer on said substrate followed by forming a ground line layer, and depositing an etching stopping layer onto said ground line layer by patterning, and then forming a second interlayer insulation layer thereover;

(b) forming a trench that extends to said etching stopping layer of said second interlayer insulation layer through said second interlayer insulation layer, forming a contact hole in said common contact area, depositing a layer thereover for the purpose of forming a said high-resistance load element and patterning said layer to form a high-resistance region, forming a power supply line that makes contact with said high-resistance region by masking said high-resistance region, so that it is possible to make the resistance length long by an amount that is a step at the sidewall of said trench.

8. A method of manufacturing a semiconductor memory device according to claim 6, wherein subsequent to said step (d) a capacitive layer is formed, and further a contact hole is formed for the purpose of making connection between a ground line and a capacitance electrode, and then a fourth conductive layer is formed.

* * * * *